United States Patent [19]

Larsen et al.

[11] Patent Number: 5,537,350

[45] Date of Patent: Jul. 16, 1996

[54] METHOD AND APPARATUS FOR SEQUENTIAL PROGRAMMING OF THE BITS IN A WORD OF A FLASH EEPROM MEMORY ARRAY

[75] Inventors: Robert E. Larsen, Shingle Springs; Jahanshir J. Javanifard, Sacramento, both of Calif.

[73] Assignee: Intel Corporation, Santa Clara, Calif.

[21] Appl. No.: 119,520

[22] Filed: Sep. 10, 1993

[51] Int. Cl.[6] .................................................. G11C 7/00
[52] U.S. Cl. ........................ 365/185.330; 365/185.180; 365/185.230; 365/189.010; 365/201; 365/226
[58] Field of Search ........................ 365/218, 185, 365/900, 194, 189.01, 222, 200, 201, 185.08, 185.23, 185.33, 226

[56] References Cited

U.S. PATENT DOCUMENTS

| | | | |
|---|---|---|---|
| 4,949,308 | 8/1990 | Araki et al. | 365/194 |
| 5,047,985 | 9/1991 | Miyaji | 365/203 |
| 5,163,021 | 11/1992 | Mehrotra et al. | 365/201 |
| 5,200,920 | 4/1993 | Norman et al. | 365/201 |
| 5,235,545 | 8/1993 | McLaury | 365/189 |
| 5,263,000 | 11/1993 | Van Buskirk et al. | 365/226 |
| 5,267,218 | 11/1993 | Elbert | 365/189.01 |
| 5,282,170 | 1/1994 | Van Buskirk et al. | 365/900 |

*Primary Examiner*—Tan T. Nguyen
*Attorney, Agent, or Firm*—Blakely, Sokoloff, Taylor & Zafman

[57] ABSTRACT

An integrated circuit arrangement for providing programming voltages to a flash EEPROM memory array including an arrangement for selecting subsets of bits of a word which is to be programmed and applying programming voltages only to the memory transistors of a selected subset.

21 Claims, 5 Drawing Sheets

METHOD AND APPARATUS FOR SEQUENTIAL PROGRAMMING OF THE BITS IN A WORD OF A FLASH EEPROM MEMORY ARRAY

BACKGROUND OF THE INVENTION

1. Field of the Invention

This invention relates to computer systems and, more particularly, to methods and apparatus for utilizing sequential programming of memory cells in a flash electrically-erasable programmable read only memory (flash EEPROM) array in order to reduce the current and power utilized.

2. History of the Prior Art

There has been a recent trend toward lowering the power requirements of portable computers. In order to reduce power consumption, much of the integrated circuitry used in personal computers is being redesigned to run at low voltage levels. The circuitry and components used in portable computers are being designed to operate at voltage levels such as 5 volts and 3.3 volts and to use less current. This helps a great deal to reduce the power needs of such computers.

However, some of the features of portable computers require higher voltages. Recently, flash electrically-erasable programmable read only memory (flash EEPROM memory) has been used to store BIOS processes. This memory may be erased and reprogrammed without removing the BIOS circuitry from the computer by running a small update program when the BIOS processes are changed. However, erasing and reprogramming flash EEPROM memory requires approximately twelve volts to accomplish effectively; and the lower voltage batteries provided in personal computers are not capable of furnishing this voltage.

In other electronic arrangements, charge pump circuits have been used to provide a high voltage from a lower voltage source. However, even though charge pumps have long been available which are capable of providing the voltages necessary for programming and erasing flash EEPROM memory arrays, no arrangement had been devised until recently for utilizing these charge pumps to provide the voltages needed to accomplish erasing and programming of flash EEPROM memory arrays using those positive source erase techniques which are used when 12 volts is available from an external source.

The primary reason for the failure is the universal perception that insufficient current can be generated using charge pumps to accomplish the erase and the programming processes. The positive source method of erasing flash EEPROM memories draws a very substantial amount of current. Similarly, programming such arrays using traditional techniques has required large amounts of current. However, recently it has been discovered that using specially designed charge pumps sufficient current can be generated to accomplish positive source erase and the concomitant programming of flash EEPROM memory arrays. A charge pump arrangement for accomplishing positive source erase is disclosed in detail in U.S. patent application Ser. No. 08/119,423, entitled Method And Apparatus For A Two Phase Bootstrap Charge Pump, K. Tedrow et al, filed on even date herewith, and assigned to the assignee of the present invention.

It is still desirable even using this advanced charge pump to reduce the amount of current used in programming flash EEPROM memory arrays. A flash EEPROM memory array is made up of memory cells which include floating gate field effect transistor devices. Such memory transistors may be programmed by storing a negative charge on the floating gate. A negative charge on the floating gate shifts the threshold voltage of the memory transistor making it less conductive. The condition of the memory transistors (programmed or erased) may be detected by interrogating the cells and sensing whether current flows or not. The conventional method of erasing an array of flash EEPROM memory cells (called positive source erase) erases all of the cells together (or at least some large block thereof). Typically, this requires the application of twelve volts to the source terminals of all of the memory cells, the grounding of the gate terminals, and the floating of the drain terminals. The programing of memory cells is typically accomplished a word at a time but conventionally requires that the drain of selected cells be placed at six or seven volts, the gate at eleven or twelve volts, and the source at ground. This programing operation draws substantial current because the gate terminal is raised above the level of the drain and source terminals while a significant potential difference is placed between the drain and source terminals.

As mentioned, using conventional techniques, programming is accomplished a word at a time. The simultaneous programming of each bit of a sixteen bit word requires approximately one milliampere of current so that programming one word draws approximately sixteen milliamperes. The peak current drawn during the conventional programming operation may be as high as forty milliamperes. This is a very large amount of current and requires bigger charge pumps with larger capacitance if charge pump circuits are in fact to be used. These bigger charge pumps with large capacitance require a large amount of die space and therefore are counterproductive in producing portable computers. Moreover, integrated circuit charge pumps cannot be made to operate as efficiently as can stand alone charge pumps because they do not make use of elements such as inductors which maximize efficiency. In fact, such charge pumps operate at efficiencies of approximately forty percent so that seventy-two milliamperes of peak current are required to supply the sixteen milliamperes necessary for programming a word.

SUMMARY OF THE INVENTION

It is, therefore, an object of the present invention to provide an arrangement for reducing the current requirements for programming flash EEPROM memory arrays.

It is another object of the present invention to provide an arrangement for reducing the currents necessary for programming flash EEPROM memory arrays to a level where such currents may be furnished by integrated circuit charge pump circuitry using a small amount of die space.

These and other objects of the present invention are realized in an integrated circuit arrangement which utilizes a charge pump to generate a high voltage output, a plurality of switching circuits joined to the output of the charge pump for selecting individual subsets of bitlines making up a word of data, and means for sequentially selecting the switching circuits to transfer current to the bitlines whereby the current necessary to program a word is divided over a number of individual sequential periods in none of which periods does the current required strain the capability of the charge pump to furnish current.

These and other objects and features of the invention will be better understood by reference to the detailed description which follows taken together with the drawings in which like elements are referred to by like designations throughout the several views.

Notation And Nomenclature

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to apparatus and to a method for operating a computer in processing electrical or other (e.g. mechanical, chemical) physical signals to generate other desired physical signals.

DETAILED DESCRIPTION

Figure 1:
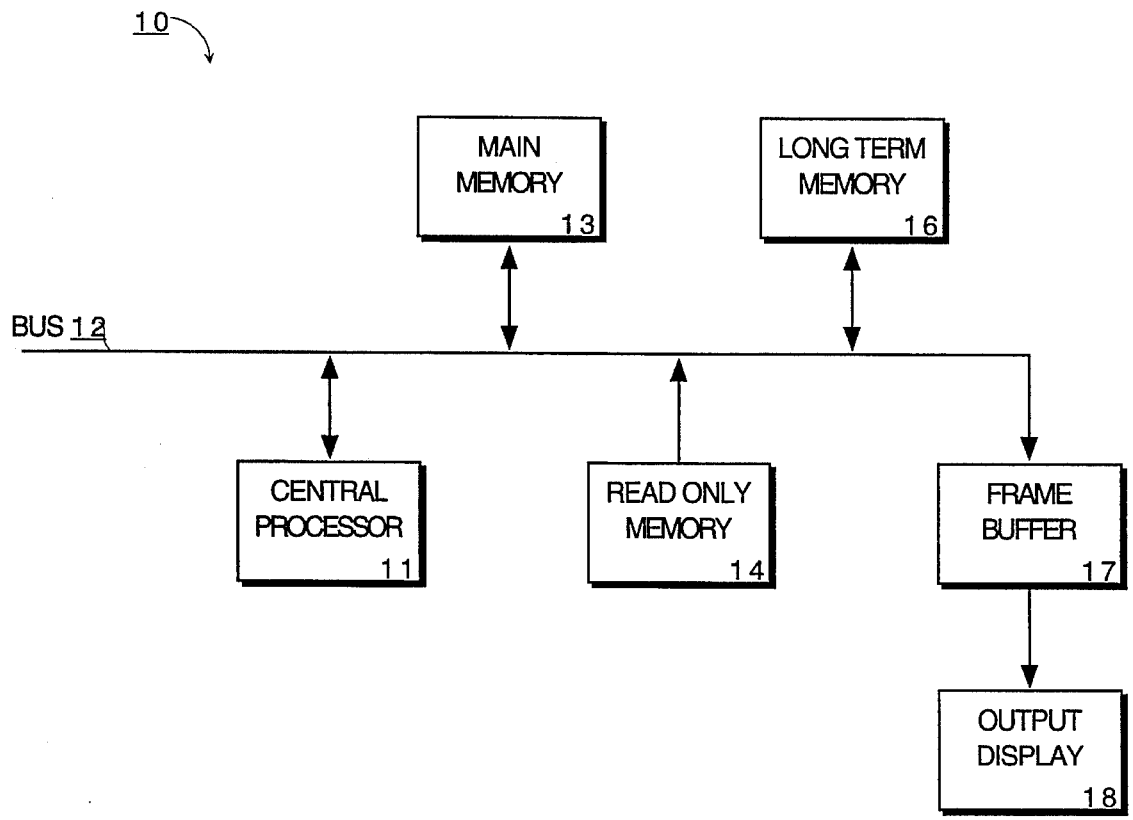
FIG. 1 is a block diagram illustrating a computer system which may utilize the present invention.

Referring now to FIG. 1, there is illustrated a computer system 10. The system 10 includes a central processor 11 which carries out the various instructions provided to the computer 10 for its operations. The central processor 11 is joined to a bus 12 adapted to carry information to various components of the system 10. Joined to the bus 12 is main memory 13 which is typically constructed of dynamic random access memory arranged in a manner well known to those skilled in the prior art to store information during a period in which power is provided to the system 10. Also joined to the bus 12 is read only memory 14 which may include various memory devices well known to those skilled in the art each of which is adapted to retain a particular memory condition in the absence of power to the system 10. The read only memory 14 typically stores various basic functions used by the processor 11 such as basic input/output processes and startup processes typically referred to as BIOS processes. Such memory 14 may be constructed of flash EEPROM memory cells adapted to be modified as various ones of the BIOS processes used by a particular computer are changed. If the memory 14 is constructed of flash EEPROM memory cells, it may be modified by running an update process on the computer itself to reprogram the values stored in the memory 14. Typically, such flash EEPROM memory will include circuitry for programming and erasing the memory array.

Also connected to the bus 12 are various peripheral components such as long term memory 16 and circuitry such as a frame buffer 17 to which data may be written which is to be transferred to an output device such as a monitor 18 for display. The construction and operation of long term memory 16 (typically electro-mechanical hard disk drives) is well known to those skilled in the art. However, rather than the typical electro-mechanical hard disk drive, a flash EEPROM memory array may be used as the long term memory 16. Such flash EEPROM memory arrays are programmed and erased through techniques which utilize voltages greater than those typically available to the integrated circuits of more advanced portable computers. Such flash EEPROM memory arrays typically include circuitry for programming and erasing the memory array. Consequently, in accordance with the present invention, such long term memory arrays as well as memory 14 may provide circuitry for generating high voltages from the lower voltages available from the batteries typically utilized with such computers.

A flash EEPROM memory array is made up of memory cells which include floating gate field effect transistor devices. Such memory transistors may be programmed to change the charge stored on the floating gate, and the condition of the transistors (programmed or erased) may be detected by interrogating the cells. The conventional method of erasing an array of flash EEPROM memory cells (called positive source erase) erases all of the cells together (or at least some large block thereof). Typically, this requires the application of twelve volts to the source terminals of all of the memory cells, the grounding of the gate terminals, and the floating of the drain terminals. The programming of memory cells is accomplished a word at a time in accordance with the data furnished but conventionally requires that the drain of selected cells be placed at six or seven volts, the gate at eleven or twelve volts, and the source at ground.

Although it has been typical to provide charge pumps to generate higher voltages when only lower voltages are available, such charge pumps have not been used for erasing and programming flash EEPROM memory arrays. Although such charge pumps are able to raise the voltage to an appropriate level, prior art charge pumps were not felt to provide sufficient current to effectively erase and program flash EEPROM memory when erased in the conventional positive source manner.

Figure 2:
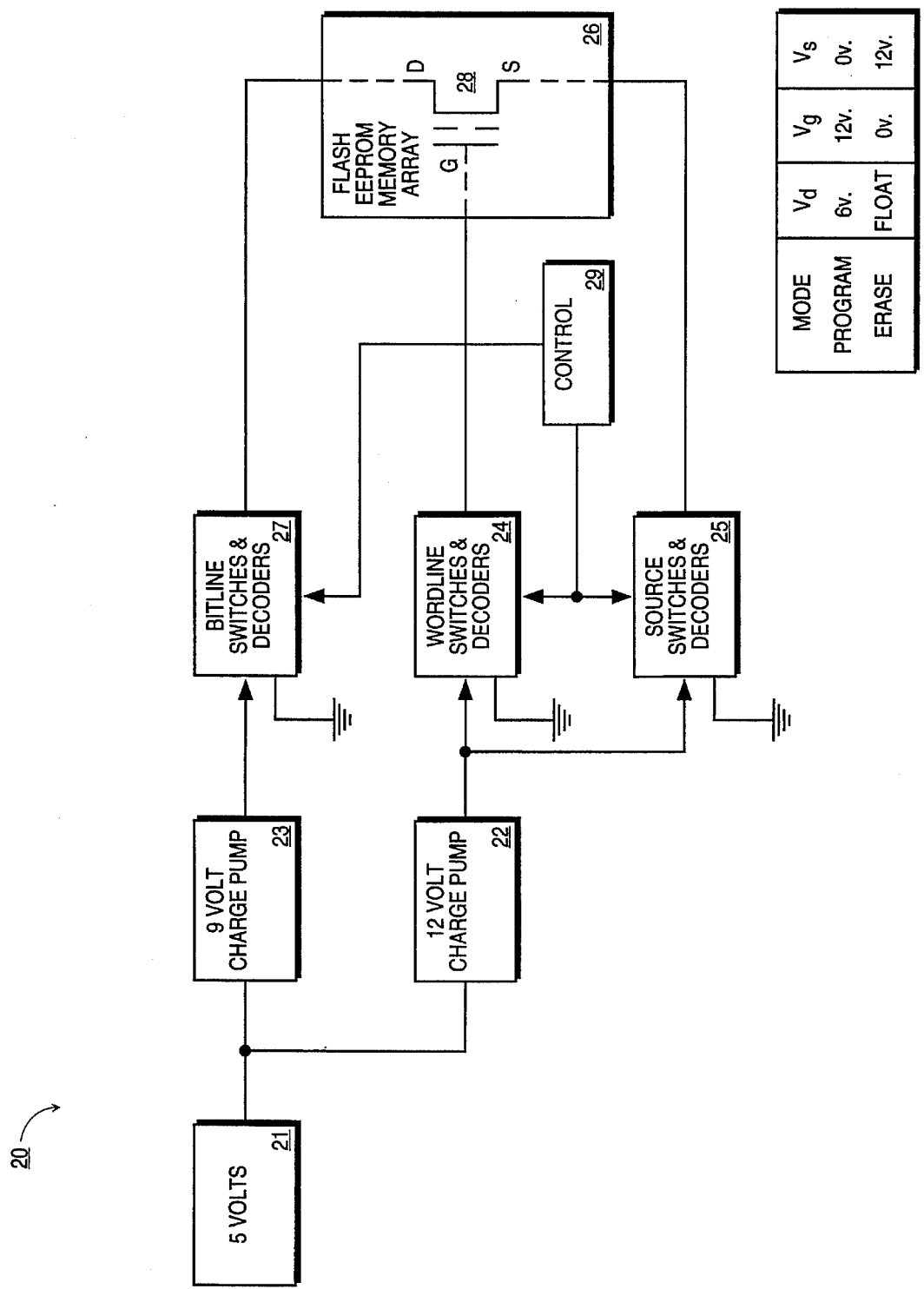
FIG. 2 is a block diagram of a circuit for providing programming and erase voltages for flash EEPROM memory arrays.

FIG. 2 is a block diagram which illustrates an integrated circuit 20 including a flash EEPROM memory array 26 and circuitry for programming and erasing the flash EEPROM memory array 26 utilizing positive source erase techniques. This circuit 20 includes a source of voltage 21 such as a low powered battery capable of furnishing five volts. Voltage from the source 21 is provided to a pair of charge pump circuits 22 and 23. The charge pump circuit 22 is devised to provide a pumped output voltage of approximately twelve volts while the charge pump circuit 23 is devised to produce a pumped output voltage of approximately nine volts.

Voltage from the charge pump 22 is furnished to a set of wordline switches and decoders 24 which, in a manner well known to those skilled in the art, provide voltages at the gate terminals of flash EEPROM memory transistor devices 28 (only one transistor device 28 is illustrated in FIG. 2). Voltage from the pump 22 is also furnished to a set of source switches and decoders 25 which, in a manner well known to those skilled in the art, provide voltages at the source terminals of flash EEPROM memory transistor devices 28. The voltage furnished by the pump 23 is furnished to a set of bitline switches and decoders 27 which, in a manner well known to those skilled in the art, provide voltages at the drain terminals of flash EEPROM memory transistor devices 28. Each of the sets of switches and decoders 24, 25, and 27 is controlled by signals from a control circuit 29 to provide appropriate voltages at erase and programming to accomplish those results. In one embodiment, the control circuit 29 is a microprocessor designed to provide control of all of the operations of the memory array 26 including reading, programming, and erasing among other things. The use of such a control circuit is described in U.S. patent application Ser. No. 08/086,186, entitled Flash Memory Array System and Method, M. Fandrich et al, filed Jun. 30, 1993, and assigned to the assignee of the present invention.

At the lower right corner of FIG. 2 is shown a table which illustrates the voltages which are typically applied to the terminals of the memory cells during the program and erase operations using positive source erase techniques. As may be seen, the erasing of the memory device 28 requires that a positive twelve volts be applied to the source terminal of the device 28, ground be applied to the gate terminal, and the drain be floated. During programming, on the other hand, the source is typically grounded while twelve volts is applied to the gate terminal and six or seven volts is applied to the drain terminal. Because the gate terminal is raised to a potential greater than either the source or drain terminals and a substantial potential is applied between source and drain terminals, substantial drain current will flow. Because of this substantial drain current when programming is conducted, the source of the programming voltage must be able to furnish a substantial amount of current. Prior to the invention of the copending patent application, it was not believed that a sufficient amount of current could be furnished for this purpose by a charge pump without the need to utilize an inordinate amount of die space for capacitors.

Figure 3:
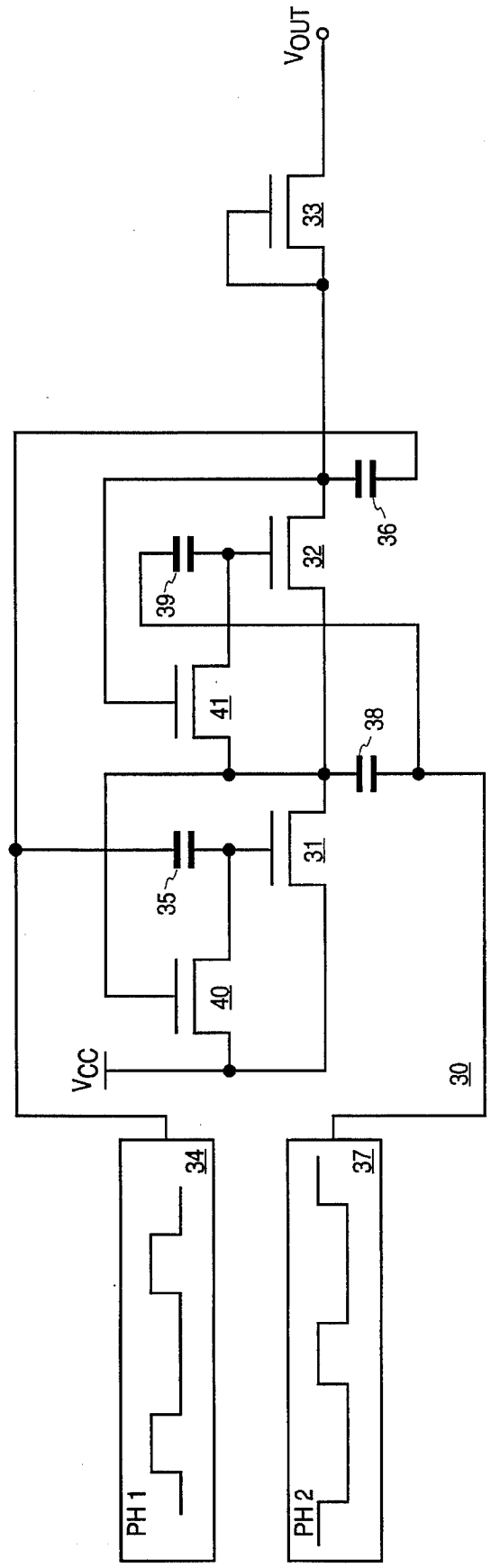
FIG. 3 is a block diagram of a charge pump which may be used in the circuit of FIG. 2 to provide voltages and currents sufficient for positive source erase techniques.

FIG. 3 illustrates a bootstrap pump arrangement 30 as described in the aforementioned copending patent application which may be utilized to provide the high voltages and currents required for programming and erasing flash EEPROM memory arrays in accordance with this invention. As is shown in FIG. 3, the pump 30 includes a number of stages of N type field effect transistor devices 31, 32, and 33 each having drain and source terminals connected in series between a source of voltage Vcc and an output terminal Vout. Input clock signals are furnished to the circuit 30 from a source of clock signals 34 by capacitors 35 and 36. A second set of input clock signals are furnished from a source of clock signals 37 via capacitors 38 and 39. Each stage of the circuit 30 includes an N channel field effect transistor device 40 or 41 providing a path between source and drain terminals to the gate terminal of the associated device 31 or 32 of that stage. The pump 30 illustrated is a two stage pump which may be used as the pump 23 illustrated in FIG. 2 to generate programming voltages for the drain of the device 28.

The two phases of input clock pulses (phase 1 and phase 2) produced by the sources 34 and 37 are applied in a unique manner in order to allow the operation of the circuit 30 to produce the desired output voltages and currents. The two phase clock signals are chosen so that they do not overlap. It may be seen that the phase 2 clock is illustrated as high initially. When this clock is high, enabling signals are applied to the gate terminal of the control device 40 and to the gate of switching device 32. These pulses turn on the control device 40. The high voltage from the source 37 is also applied at the drain of the device 32, and the high voltages at both the drain and gate of the device 32 cause it to turn on. When the device 32 turns on, its drain and gate are initially at the same value. The drain and gate have been brought to this value by the conduction of the device 41 during the immediately preceding period in which the phase 1 clock signal was high. However, since the phase 1 clock is now low, the control device 41 joining the drain and gate of the device 32 is off. Thus, after the device 32 has been on for any significant portion of the high phase 2 clock period, the high voltage at the drain transfers charge from the capacitor 38 to the capacitor 36, reducing the voltage level at the drain of the device 32. This causes the voltage at the gate of the device 32 to be higher than either the drain or the source; and the device 32 switches completely on without any threshold voltage drop. Thus, the transfer of charge from the capacitor 38 to the capacitor 36 does not dissipate power due to a threshold drop once the device 32 begins to turn on.

As the voltage at the drain and source of the device 32 begin to equalize, the voltage at the gate of the control device 41 is raised along with the voltage at the source of the device 32 so that the control device 41 starts to turn on. This tends to raise the voltage at the drain of the device 32 to the level of the gate of the device 32 so that current does not flow back through the device 32 from the capacitor 36 to the capacitor 38. When the phase 2 clock pulse goes low, the drain of the device 41 drops lower than the gate; and the device 41 continues to turn on. Simultaneously, the gate terminal of the control device 40 is lowered turning off the device 40 so that the drain and gate terminals of the device 31 are isolated from each other but at the same voltage. The lowering of the voltage at the gate of the device 32 when the phase 2 pulse goes low causes the device 32 to begin to turn off. When the phase 1 clock pulse goes high, the device 41 switches completely on and equalizes the voltage at the gate and drain of the device 32. At the same time, the gate terminal of the device 31 is raised by the value Vcc.

The device 31 functions similarly to the device 32 in transferring charge to the capacitor 38. The gate and drain terminals of this device are initially equal, but then the drain voltage drops as charge is transferred to the capacitor of the next stage so that the devices are switched completely on and experience no threshold voltage drop.

Thus, when the phase 1 clock goes high, the device 31 turns on; and current provided by the source Vcc charges the capacitor 38. When the phase 1 pulse goes low the device 31 switches off. Then the phase 2 clock pulse turns on the device 32; and the capacitor 38 provides stored charge and charge due to the phase 2 pulse to the capacitor 36. The device 32 switches off when the phase 2 pulse goes low. When the phase 1 pulse again goes high, the source Vcc again charges the capacitor 38.

Ultimately, the charging of the capacitor 36 and the positive swing of the phase 2 clock pulse raise the voltage level on the capacitor 36 sufficiently above the level Vout to cause the conduction of the switching device 33. When the phase 1 clock goes high, the output device 33 turns on and furnishes a pumped voltage at Vout. It should be noted that the last stage operates in a range in which it exhibits a Vt drop.

This operation provides the desired output voltage while furnishing the high level of current necessary to erase and program flash EEPROM memory arrays. The two stage pump circuit 30 illustrated in FIG. 3 furnishes approximately N (where N is the number of stages) plus one times the voltage of the source Vcc less the Vt drop of the device 33 as open circuit voltage at the output terminal. For example, with Vcc equal to 4.4 volts, an output voltage of 12.7 volts is furnished at the output of the pump circuit 30. Thus, as may be seen, the arrangement of FIG. 3 provides a reliable charge pump circuit capable of producing high levels of current.

The pump 30 illustrated in FIG. 3 may be used to furnish the source voltage during erase and the gate voltage during programming of the memory cells by increasing its size. The larger charge pump 22 of FIG. 2 required to furnish the voltage used at the source terminals and the gate terminals of the flash EEPROM memory cells during erasing and programming, respectively, of the array may be provided by a charge pump in which one more stage is used. For example, a charge pump having three stages is capable of providing an output voltage which may be used at the source terminals of the memory cells during erasing or at the gate terminals during programming.

As will be apparent to those skilled in the art, the charge pump circuit of FIG. 3 provides output voltages and currents which are substantially greater than those provided by prior art charge pumps. The lack of threshold drop at each stage provides an output current which is approximately twice the current which prior art non-bootstrap charge pumps were able to provide. However, in order to assure that sufficient current is available for programming, a new programming arrangement has been devised.

In order to further reduce the current used in programming the memory cells of the flash EEPROM memory array, a circuit in accordance with the present invention has been provided. In this circuit, rather than programming all of the bits of a word simultaneously as has been done in prior art arrangements, the bits are programmed sequentially, four bits at a time. In this manner, rather than 16 milliamperes being required at once to program the array, only 4 milliamperes is required at any instant. Consequently, both the average and peak currents are reduced to values which may be conveniently provided by the charge pump circuits illustrated.

In order to reduce the current required at the output of the charge pump 30 of FIG. 3, the output voltage provided by the charge pump 30 is connected to provide the drain voltage necessary to program some subportion of a word. In an embodiment illustrated in FIG. 4, the 15 output of the charge pump is furnished in sequence to subsets of four bitlines by sets of switches which cooperate with the column decoding circuitry. In this manner, a charge pump need only provide sufficient current to program four memory cells simultaneously. Operating in this manner requires only approximately four milliamperes of average programming current during any programming interval rather than the sixteen milliamperes which is typical of prior art arrangements. It will be understood that the number of bits selected in a subset to be programmed is a function of the current capacity of a particular charge which in turn depends upon the size of the charge pump circuit elements. In particular cases, either more or fewer bits of a word might be programmed.

Figure 4:
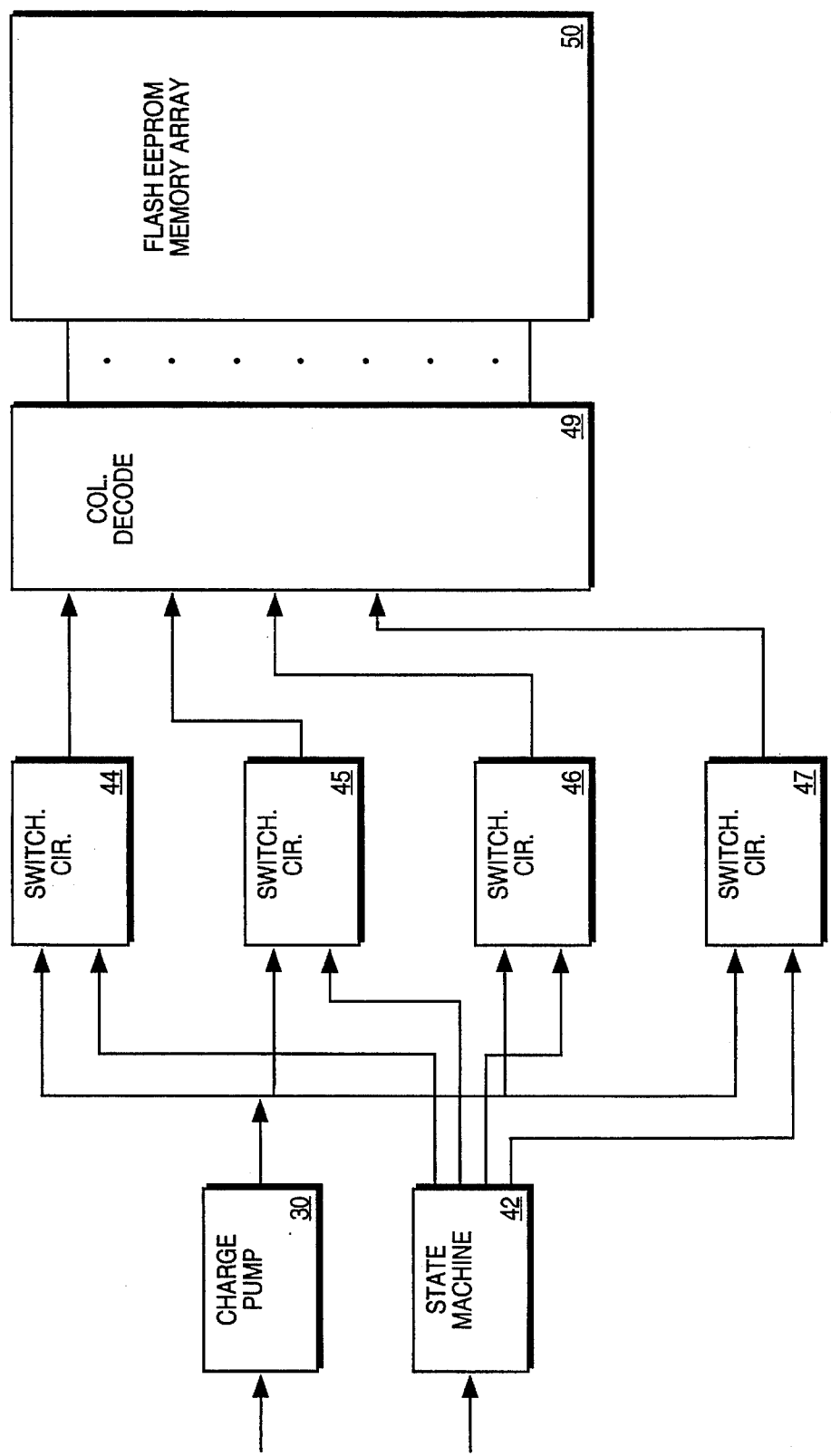
FIG. 4 is a block diagram of a circuit in accordance with the present invention for controlling the output voltage of a charge pump such as that illustrated in FIG. 3.
Figure 5:
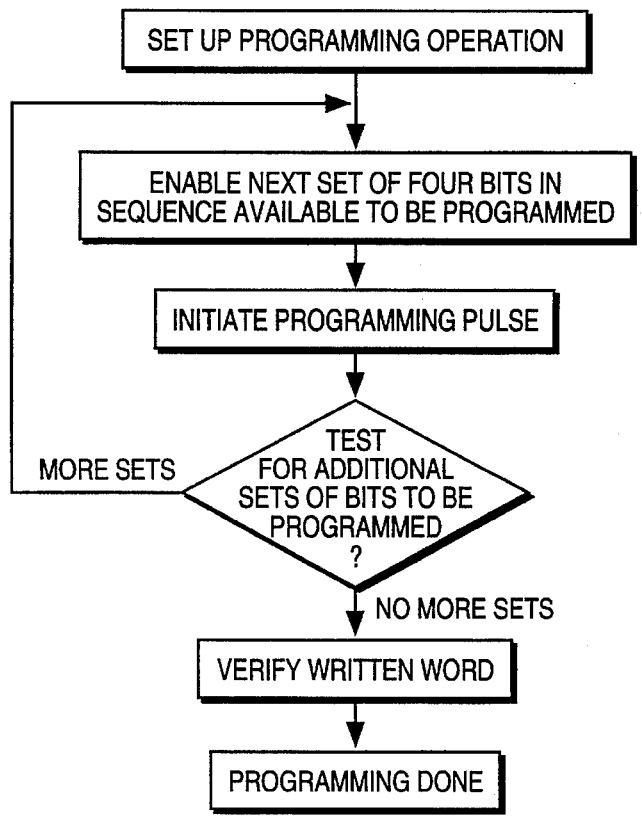
FIG. 5 is a flow chart illustrating a first method of practicing the present invention.

As illustrated in FIG. 4, a charge pump 30 provides an output voltage and current which is used for programming a word of the memory array. The output voltage is provided to four individual switching circuits 44–47. Each of these switching circuits 44–47 receives input control signals from a state machine 42 which enable the connection of the voltage provided at the output of the charge pump to one after another of the four sets of bitlines selected at the output of the switching circuits 44–47 in sequence. The state machine sends enabling signals to the switching circuits 44–47 in a constant sequence which repeats for each word which is programmed. Other circuitry such as a controller circuit, a processor, or some other method of generating a sequence of pulses may be used in place of the state machine in particular embodiments to furnish the enabling signals. Consequently, as is shown in FIG. 5 which illustrates the flow of the programming process, a first enable signal is generated by the state machine 42 and transferred to the first switching circuit 44 of the individual switching circuits 44-47. The circuit 44 controls, for example, the transfer of voltage to bits 0 through 3 of the word selected to be programmed. This first enable signal allows the voltage provided by the charge pump 30 to be applied to the four bitlines connected to that switching circuit 44–47 which are to be programmed for transfer to the drain terminals of the memory devices. In each case, the actual bitlines to be programmed are selected by the column decoding circuitry 49. Once the appropriate ones of the bitlines of the first subset of bitlines have received the appropriate high voltage from the charge pump 30 and programming has occurred, another (second) enable signal is generated by the state machine 42 and transferred to the second of the individual switching circuits 45 so that the voltage provided by the charge pump 30 may be applied to those ones of the four bitlines (for example, bits 4 through 7 of the selected word being programmed) connected to that switching circuit 45 which are to be programmed. This generation of enabling pulses and programming of sets of four bitlines continues in sequence through the subsets of four bits of selected words until all of the bits of the word have been programmed. After each set of four bits, a test may be run to determine whether additional sets of bits exist in the word which are yet to be programmed. After the word has been programmed, its programming may be verified by testing data in the memory positions against the data provided for programming. The method for verifying the testing is explained in the copending patent application entitled Flash Memory Array System and Method, referred to above. The enabling cycle is repeated for sequential subsets of bits with the next data word and with each other data word to be programmed. This method of programming substantially reduces the current required from a charge pump to accomplish programming.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A computer system comprising:

a central processor;

a memory arrangement comprising:

a flash EEPROM memory array including a plurality of floating gate field effect transistor devices, each floating gate field effect transistor device storing at least one bit, a first charge pump for providing a first positive voltage to be applied to drain terminals of the floating gate field effect transistor devices during a programming operation, a plurality of switching circuits each coupled to receive the first positive voltage provided by the first charge pump and for transferring that first positive voltage to selected subgroups of a plurality of subgroups of bitlines of the array, and logic circuitry coupled to the plurality of switching circuits for enabling the plurality of switching circuits in a selected order, such that a switching circuit of the plurality of switching circuits is enabled to couple the first positive voltage to a selected subgroup of the plurality of subgroups of bitlines until the floating gate field effect transistor devices coupled to the bitlines to be programmed are programmed; and a system bus for transferring data and addresses between the central processor and the memory arrangement.

2. A computer system as claimed in claim 1, wherein the logic circuitry comprises a state machine, said state machine enabling each of the plurality of switching circuits in a selected sequential order such that the first voltage is applied individually to each subgroup until selected bits of each subgroup have been programmed.

3. The computer system as set forth in claim 2, further comprising column decode circuitry coupled to the switching circuit to select the bitlines of a subgroup to connect to receive the first voltage such that selected bits are programmed.

4. A computer system as claimed in claim 1 in which each of the subgroups includes four bitlines.

5. A computer system as claimed in claim 1 in which the plurality of switching circuits comprises four switching circuits, a switching circuit of the plurality of switching circuits coupled to a corresponding subgroup of four bitlines.

6. A computer system as claimed in claim 1 in which the plurality of means for transferring the first positive voltage to a selected plurality of subgroups of bitlines of the array means comprises four switching circuits, a switching circuit of the plurality of switching circuits coupled to a corresponding subgroup of four bitlines.

7. A memory arrangement comprising:

a flash EEPROM memory array including a plurality of floating gate field effect transistor devices, each floating gate field effect transistor device storing at least one bit, a first charge pump for providing a first positive voltage to be applied to drain terminals of the floating gate field effect transistor devices during a programming operation, a plurality of switching circuits each coupled to receive the first positive voltage provided by the first charge pump and for transferring that first positive voltage to a selected subgroups of a plurality of subgroups of bitlines of the array, and logic circuitry coupled to the plurality of switching circuits for enabling the plurality of switching circuits in a selected order such that a switching circuit of the plurality of switching circuits is enabled to couple the first positive voltage to a selected subgroup of the plurality of subgroups of bitlines until the floating gate field effect transistor devices coupled to the bitlines to be programmed are programmed.

8. A memory arrangement as claimed in claim 7, wherein the logic circuitry comprises a state machine, said state machine enabling each of the plurality of switching circuits in a selected sequential order such that the first voltage is applied individually to each subgroup until selected bits of each subgroup have been programmed.

9. The computer system as set forth in claim 8, further comprising column decode circuitry coupled to the switching circuit to select the bitlines of a subgroup to connect to receive the first voltage such that selected bits are programmed.

10. A memory arrangement as claimed in claim 7 in which each of the subgroups includes four bitlines.

11. A memory arrangement as claimed in claim 7 in which the plurality of switching circuits comprises four switching circuits, a switching circuit of the plurality of switching circuits coupled to a corresponding subgroup of four bitlines.

12. A computer system comprising:

central processing means;

means for providing storage of data comprising flash EEPROM memory array means including a plurality of floating gate field effect transistor devices, each floating gate field effect transistor device storing at least one bit, charge pump means for providing a first positive voltage to be applied to drain terminals of the floating gate field effect transistor devices during a programming operation, a plurality of means for transferring the first positive voltage to selected subgroups of a plurality of subgroups of bitlines of the array means, and means for enabling in a selected order the plurality of means for transferring the first positive voltage to a selected subgroup of a plurality of subgroups of bitlines of the array means, such that a selected means for transferring of the plurality of means for transferring is enabled to couple the first positive voltage to a selected subgroup of the selected plurality of subgroups of bitlines until selected floating gate field effect transistor devices coupled to the bitlines are programmed; and system bus means for transferring data and addresses between the central processing means and the means for providing storage for data.

13. A computer system as claimed in claim 12, wherein the means for enabling in a selected sequential order the plurality of means for transferring the first positive voltage to a selected plurality of subgroups of bitlines of the array means is a state machine, said state machine enabling each of the plurality of means for transferring the first positive voltage to a selected plurality of subgroups of bitlines of the array means such that the first voltage is applied individually to each subgroup until selected bits of each subgroup have been programmed.

14. A computer system as claimed in claim 12 in which each of the subgroups includes four bitlines.

15. An arrangement for providing storage of data comprising:

flash EEPROM memory array means including a plurality of floating gate field effect transistor devices, each floating gate field effect transistor device storing at least one bit, charge pump means for providing a first positive voltage to be applied to drain terminals of the floating gate field effect transistor devices during a programming operation, a plurality of means for transferring the first positive voltage to selected subgroups of a plurality of subgroups of bitlines of the array means, and means for enabling in a selected order the plurality of means for transferring the first positive voltage to a selected selected subgroup of a plurality of subgroups of bitlines of the array means, such that a selected means for transferring of the plurality of means for transferring is enabled to couple the first positive voltage to a selected subgroup of the selected plurality of subgroups of bitlines until selected floating gate field effect tranistor devices coupled to the bitlines are programmed.

16. An arrangement for providing storage of data as claimed in claim 15, wherein the means for enabling in a selected sequential order the plurality of means for transferring the first positive voltage to a selected plurality of subgroups of bitlines of the array means is a state machine, said state machine enabling each of the plurality of means for transferring the first positive voltage to a selected plurality of subgroups of bitlines of the array means such that the first voltage is applied individually to each subgroup until selected bits of each subgroup have been programmed.

17. An arrangement for providing storage of data as claimed in claim 15 in which each of the subgroups includes four bitlines.

18. An arrangement for providing storage of data as claimed in claim 15 in which the plurality of means for transferring the first positive voltage to a selected plurality of subgroups of bitlines of the array means comprises four switching circuits, a switching circuit of the plurality of switching circuits coupled to a corresponding subgroup of four bitlines.

19. A method for programming 1 flash EEPROM memory array including a plurality of floating gate field effect transistor devices comprising the steps of:

providing a first positive voltage, providing a plurality of switching circuits to transfer the first positive voltage to a subgroup of bitlines connected to a plurality of floating gate field effect transistor devices, said plurality of floating gate field effect transistor devices storing a subgroup of bits of a word, applying an enabling pulse to a selected switching circuit of a plurality of switching circuit until the corresponding subgroup of bits are verified as programmed, and repeating each of the foregoing steps to select switching circuits, and to apply enabling pulses until all bits of a selected word have been programmed, the steps repeated such that the switching circuits are selected in a sequential order such that the first voltage is applied individually to each subgroup until selected bits of each subgroup have been programmed.

20. A method as claimed in claim 19 which includes the further step of testing after each step of applying a enabling pulse to determine whether additional subgroups of bits exist in the word which have not yet been programmed.

21. A method as claimed in claim 19 which includes the further step of verifying that all bits of a selected word have been programmed.

* * * * *